(12) United States Patent
Yokoyama

(10) Patent No.: US 6,396,110 B1
(45) Date of Patent: May 28, 2002

(54) SEMICONDUCTOR DEVICE WITH MULTIPLE EMITTER CONTACT PLUGS

(75) Inventor: Hiroaki Yokoyama, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/514,385

(22) Filed: Feb. 28, 2000

Related U.S. Application Data

(63) Continuation of application No. 09/049,194, filed on Mar. 27, 1998, now abandoned.

(30) Foreign Application Priority Data

Mar. 28, 1997 (JP) .................................................. 9-78589

(51) Int. Cl.⁷ ........................ H01L 29/76; H01L 27/082; H01L 27/102

(52) U.S. Cl. .................... 257/378; 257/587; 257/588

(58) Field of Search ............................. 257/379, 378, 257/578, 591, 593, 587, 588, 580, 565, 758, 382, 370

(56) References Cited

U.S. PATENT DOCUMENTS

| | | | | |
|---|---|---|---|---|
| 5,238,850 A | | 8/1993 | Matsunaga et al. | 257/382 |
| 5,442,226 A | * | 8/1995 | Maeda et al. | 257/588 |
| 5,691,574 A | | 11/1997 | Suzuki | 257/758 |

FOREIGN PATENT DOCUMENTS

| | | | | |
|---|---|---|---|---|
| JP | 62-101071 | * | 5/1987 | 257/565 |
| JP | 3-261168 | | 11/1991 | 257/370 |
| JP | 3-270029 | * | 12/1991 | 257/565 |
| JP | 5-190778 | | 7/1993 | 257/370 |
| JP | 5-304262 | | 11/1993 | 257/378 |

* cited by examiner

*Primary Examiner*—Steven Loke
(74) *Attorney, Agent, or Firm*—Young & Thompson

(57) ABSTRACT

A semiconductor device, such as a BiCMOS, includes a bipolar transistor having at least an emitter region. An emitter electrode is formed on the emitter region. Further, a wiring pattern is formed over the emitter region. A plurality of contact plugs are formed to electrically connect the emitter electrode with the wiring pattern. The contact plugs are partially embedded in the emitter electrode in order to prevent of reduction of the current amplification factor of the bipolar transistor.

4 Claims, 6 Drawing Sheets

US 6,396,110 B1

SEMICONDUCTOR DEVICE WITH MULTIPLE EMITTER CONTACT PLUGS

CROSS-REFERENCE TO RELATED APPLICATIONS

This application is a continuation of copending application Ser. No. 09/049,194, filed Mar. 27, 1998, now abandoned.

BACKGROUND OF THE INVENTION

This invention relates to a semiconductor device having a bipolar transistor and a method of manufacturing the same, and in particular, to a BiCMOS semiconductor device and a method of manufacturing the same.

Generally, a semiconductor device often includes a BiCMOS integrated circuit in which a bipolar transistor and a complimentary MOS (CMOS) transistor are formed on the same chip. Herein, the CMOS transistor is advantageous in structuring a logic circuit while the bipolar transistor is advantageous in constituting a linear circuit such as an amplifier circuit. The above BiCMOS integrated circuit has both advantages of the CMOS transistor and the bipolar transistor.

Such a BiCMOS integrated circuit often constitutes a SRAM which has a memory cell portion and a sense amplifier portion which is arranged at the periphery of the memory cell portion. In this event, the memory cell portion is composed of the CMOS transistors while the sense amplifier portion is composed of the bipolar transistors. Herein, it is to be noted that the SRAM consisting of the BiCMOS will be thereinafter referred to as a BiCMOS SRAM.

In such a BiCMOS SRAM, a MOS transistor region and a bipolar transistor region are placed adjacent to each other via a field oxide film. In this event, the MOS transistor has a drain region, a source region and a gate region while the bipolar transistor has a base region, an emitter region and a collector region. Further, an emitter electrode is formed on the emitter region.

In this case, the MOS transistor is covered with a first insulating layer in the MOS transistor region while the bipolar transistor is covered with a second insulating layer in the bipolar transistor region. Further, a first wiring layer is formed on the first insulating layer while a second wiring layer is formed on the second insulating layer.

Herein, the thickness of the second insulating layer in the bipolar transistor region becomes thinner than that of the first insulating layer in the MOS transistor region. This thickness difference is caused by the manufacturing process. Consequently, the height between the bipolar transistor and the second wiring pattern is generally different from the height between the MOS transistor and the first wiring pattern.

Under the circumstances, a first contact hole is formed in the first insulating layer in the MOS transistor region by the use of the known dry-etching process. At the same time, second contact hole is formed in the second insulating layer in the bipolar transistor region in the same manner. Further, a first contact plug is embedded in the first contact hole while a second contact plug is embedded in the second contact hole.

In this event, the second insulating layer in the bipolar transistor region is quickly etched as compared to the first insulating layer in the MOS transistor region. Consequently, the emitter electrode is excessively or partially etched. Thus, when the emitter electrode is excessively etched, the characteristic of the bipolar transistor is degraded.

Specifically, when the emitter electrode is partially etched, the thickness of the emitter electrode becomes thin. Consequently, the ratio of holes which recombine in the emitter electrode is reduced. As a result, the base current of the base region is increased. The increase of the base current reduces the direct current amplification factor of the bipolar transistor.

SUMMARY OF THE INVENTION

It is therefore an object of this invention to provide a semiconductor device which is capable of preventing reduction of a direct current amplification factor in a semiconductor device having a bipolar transistor.

It is another object of this invention to provide a BiCMOS semiconductor device which is operable at a high speed.

It is still another object of this invention to provide a method of manufacturing a semiconductor device or a BiCMOS semiconductor device which is capable of forming contact plugs in insulating layers which have different thickness and which are formed in a bipolar transistor region and a MOS transistor region.

According to this invention, a semiconductor device includes a bipolar transistor having at least an emitter region. An emitter electrode is formed on the emitter region. Further, a wiring pattern is formed over the emitter region. With such a structure, a plurality of contact plugs are formed to electrically connect the emitter electrode with the wiring pattern. In this event, the contact plugs are partially embedded in the emitter electrode in order to preventing reduction of the current amplification factor of the bipolar transistor.

Further, the semiconductor device (BiCMOS) includes a CMOS transistor which has at least source and drain regions and a bipolar transistor which has at least an emitter electrode and which is arranged adjacent to the CMOS transistor. In this event, a first insulating layer is formed on the CMOS transistor. Further, a first wiring pattern is formed on the first insulating layer and over the CMOS transistor. A first contact plug is formed in the first insulating layer to electrically connect either one of the source and drain regions with the wiring pattern.

On the other hand, a second insulating layer is formed on the bipolar transistor. Further, a second wiring pattern is formed on the second insulating layer and over the bipolar transistor. A plurality of second contact plugs are formed in the second insulating layer to electrically connect the emitter electrode with the second wiring pattern.

In this event, the second contact plugs are partially embedded in the emitter electrode in order to prevent the reduction of the current amplification factor of the bipolar transistor.

In the semiconductor device (BiCMOS), the current amplification factor of the bipolar transistor can be suitably determined in accordance with the purposes by selecting the number of the second contact plugs in accordance with the height difference between the first contact plug and the second contact plug.

DESCRIPTION OF THE PREFERRED EMBODIMENT

Figure 1:
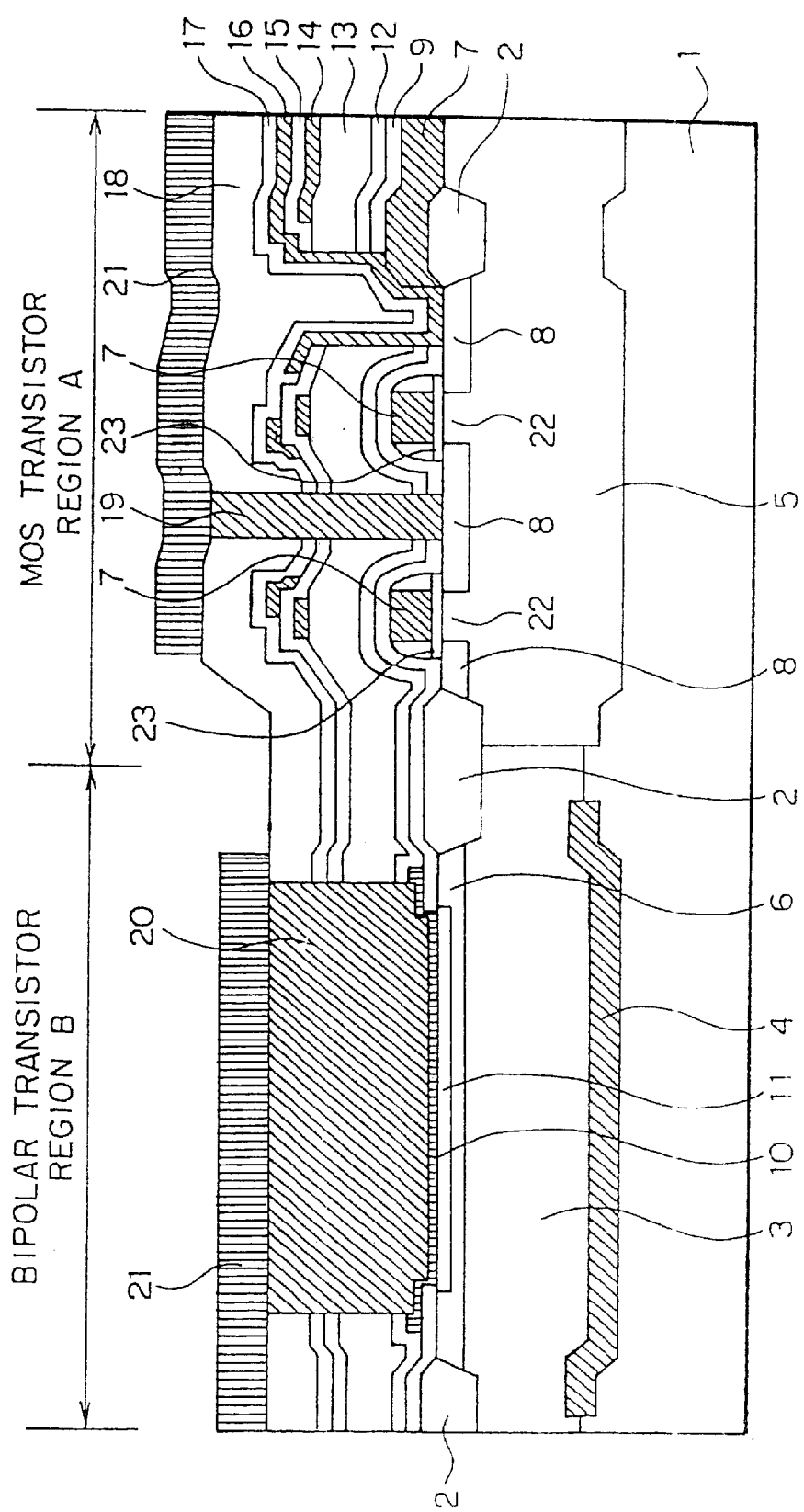
FIG. 1 is a sectional view showing a conventional semiconductor device.

Referring to FIG. 1, a conventional semiconductor device (BiCMOS SRAM) will be first described for a better understanding of this invention. The semiconductor device is equivalent to the conventional semiconductor device mentioned in the preamble of the instant specification.

In a conventional BiCMOS SRAM, an N-type epitaxial layer 3 is formed by the use of the known epitaxial growth process on a P-type semiconductor substrate 1. Further, a surface of the epitaxial layer 3 is divided into a MOS transistor region A and a bipolar transistor region B by an insulating film 2 for a device separation. In this event, a memory cell portion is structured by the MOS transistor region A while a peripheral circuit portion is structured by the bipolar transistor region B. Alternatively, the N-type epitaxial layer 3 may be formed by the use of the known ion implantation process Moreover, an N-type embedded layer 4 is formed in the bipolar transistor region B. In addition, a P-type intrinsic base region 6 is formed in the epitaxial region 3 of the bipolar transistor region B and further, an N-type emitter diffusion region 11 is formed in the base region 6. In this example, an emitter electrode 10 of a polysilicon is placed on the emitter diffusion region 11.

On the other hand, a P-type well region 5 is formed in the MOS transistor region A. Further, $N^+$-type drain and source regions 8 are formed so as to interpose a channel region 22 therebetween. A gate oxide film 23 is deposited on the channel region 22 and further, a gate electrode 7 is formed on the gate oxide film 23. The gate electrode 7 extends on the other region, such as the insulating film 2, for electrical connection.

First, second and third oxide silicon films 9, 12 and 13 are deposited on the gate electrode 7 and further, a ground wiring pattern 14 is selectively formed on the third oxide silicon film 13. The ground wiring pattern 14 is covered with a fourth oxide silicon film 15. Thereafter, the first to fourth oxide silicon films are selectively etched to form an opening at a position which corresponds to either one of the source and drain regions 8 in the MOS transistor region A. Further, polysilicon 16 is formed as a resistance so as to electrically contact with either one of the source and drain regions 8. Successively, fifth and sixth oxide silicon films 17 and 18 are sequentially deposited on the polysilicon 16. Moreover, the surface of the sixth oxide silicon film 18 is flattened.

As illustrated in FIG. 1, the surface of the sixth oxide silicon film 18 in the MOS transistor region A is higher than the surface of the sixth oxide silicon film 18 in the bipolar transistor region B. This is because the gate electrode 7, the ground wiring pattern 14 and the polysilicon 16 are placed in the MOS transistor region A in addition to the insulating layers of the oxide silicon films.

With such a structure, an Al wiring pattern 21 is selectively formed on the sixth oxide silicon film 18 in the MOS transistor region A and the bipolar transistor region B. In this event, the Al wiring pattern 21 must be electrically connected to the emitter electrode 10 in the bipolar transistor region B and either one of the source and drain regions 8 in the MOS transistor region A.

To this end, contact holes 19 and 20 are formed on either one of the source and drain regions 8 and on the emitter electrode 10. Herein, the depth of the contact hole 19 on either one of the source and drain regions is deeper than the depth of the contact hole 20 on the emitter electrode 10. This is caused by the thickness difference between the insulating layers in the MOS transistor region A and the bipolar transistor region B.

Figure 2:
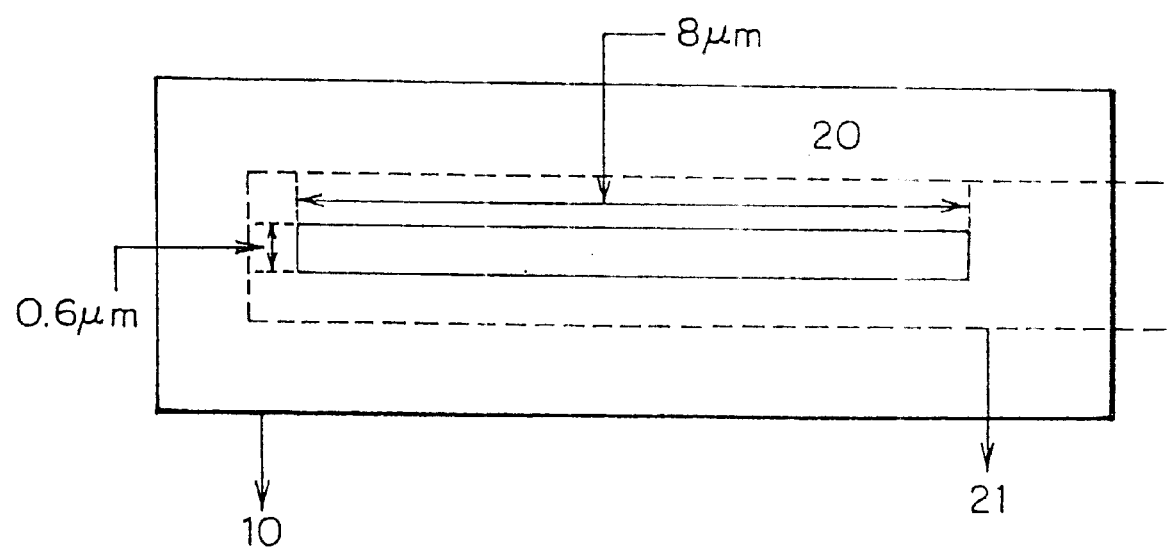
FIG. 2 a partial plan view showing a bipolar transistor region of a semiconductor device illustrated in FIG. 1.

As illustrated in FIG. 2, the contact hole 20 in the bipolar transistor region B is formed in a slit shape and has the width of 0.6 $\mu$m and the length of 8 $\mu$m. On the other hand, the contact hole 19 in the MOS transistor region A is smaller than the slit shaped contact hole 20 and has a square shape of about 0.5 $\mu$m. Further, contact plugs of W are embedded in the above contact holes 19 and 20.

When the above contact holes 19 and 20 are opened, if contact holes are opened on the basis of only the contact hole 20 in the bipolar transistor region B, the contact hole 19 does not reach the source and drain regions 8 in the MOS transistor region A. Consequently, the MOS transistor is put into an open state to obtain a defective product. This is because the insulating layer in the MOS transistor region A is thicker than the insulating layer in the bipolar transistor region B.

Therefore, the contact hole 20 in the bipolar transistor region B must be opened in accordance with the depth of the contact hole 19 in the MOS transistor region A. Consequently, the emitter electrode 10 is excessively etched. Specifically, the polysilicon of the emitter electrode 10 is partially etched by the dry-etching process during opening the contact hole 20. As a result, the thickness of the emitter electrode 10 itself inevitably becomes thin.

When the thickness of the emitter electrode 10 is thinned as mentioned above, the ratio of holes which recombine in the polysilicon of the emitter electrode 10 is reduced. Consequently, the base current Ib in the base region 6 increased. As a result, the direct current amplification factor ($h_{FE}$) becomes small with the increase of the base current Ib. Herein, the direct current amplification factor ($h_{FE}$) of the bipolar transistor is determined by the ratio between the collector current Ic and the base current Ib (namely, Ic/Ib).

Taking the above-mentioned problem into consideration, this invention provides a semiconductor device which is capable of preventing the reduction of the the direct current amplification factor of the bipolar transistor in the semiconductor device.

Figure 3:
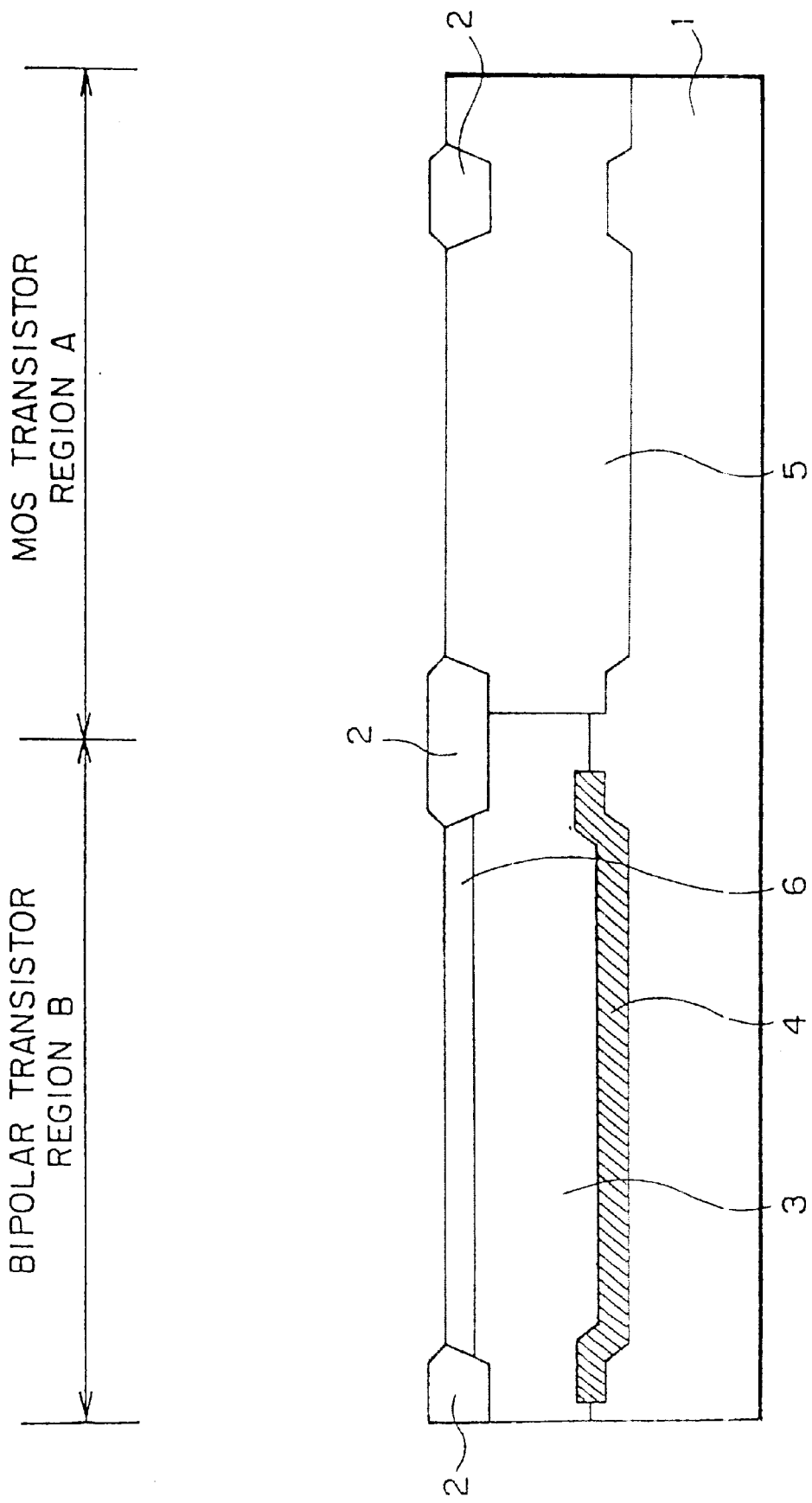
FIG. 3 is a sectional view showing a part of a manufacturing process of a semiconductor device according to this invention.
Figure 4:
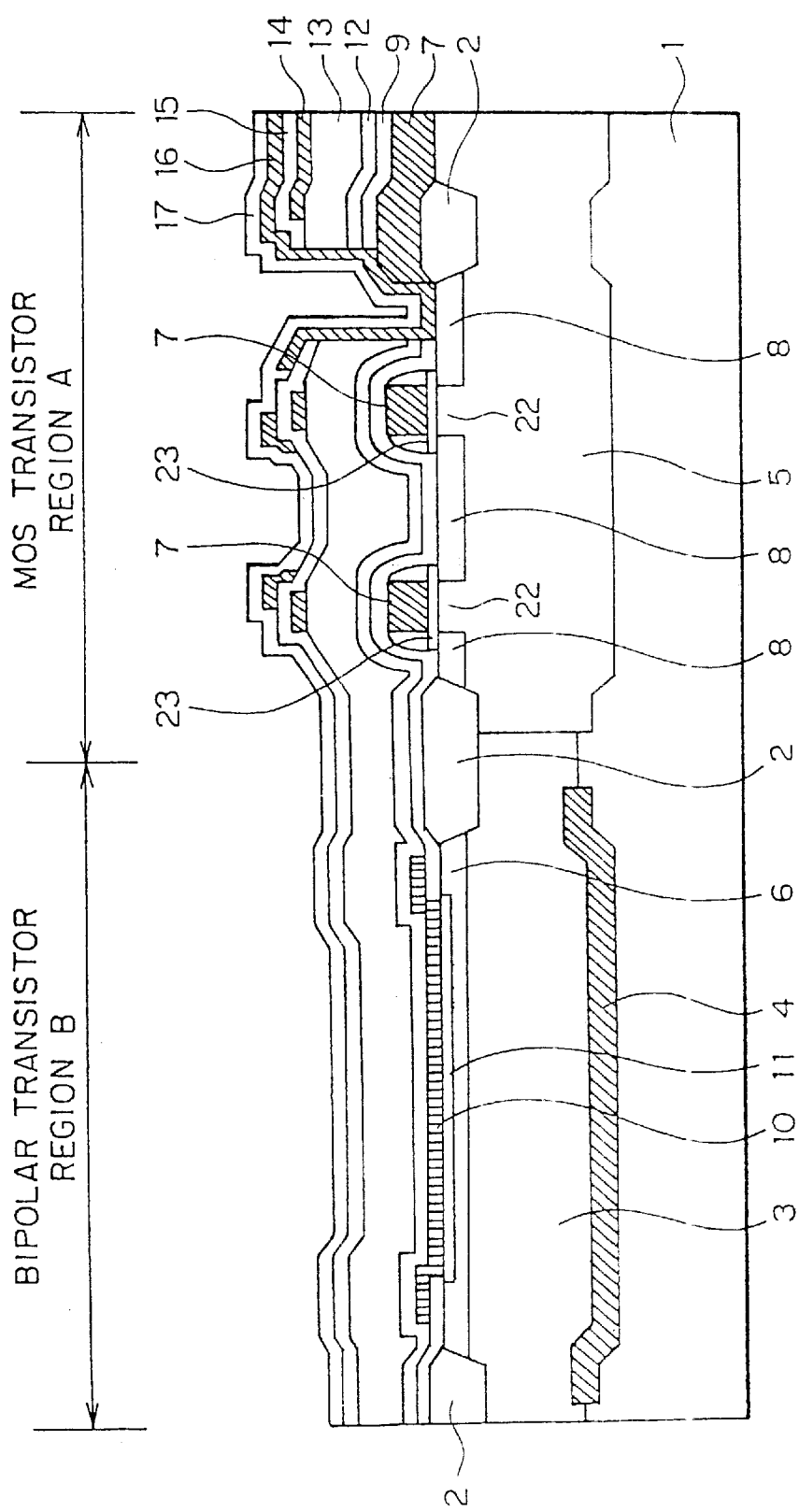
FIG. 4 is a sectional view showing another part of a manufacturing process of a semiconductor device according to this invention.
Figure 5:
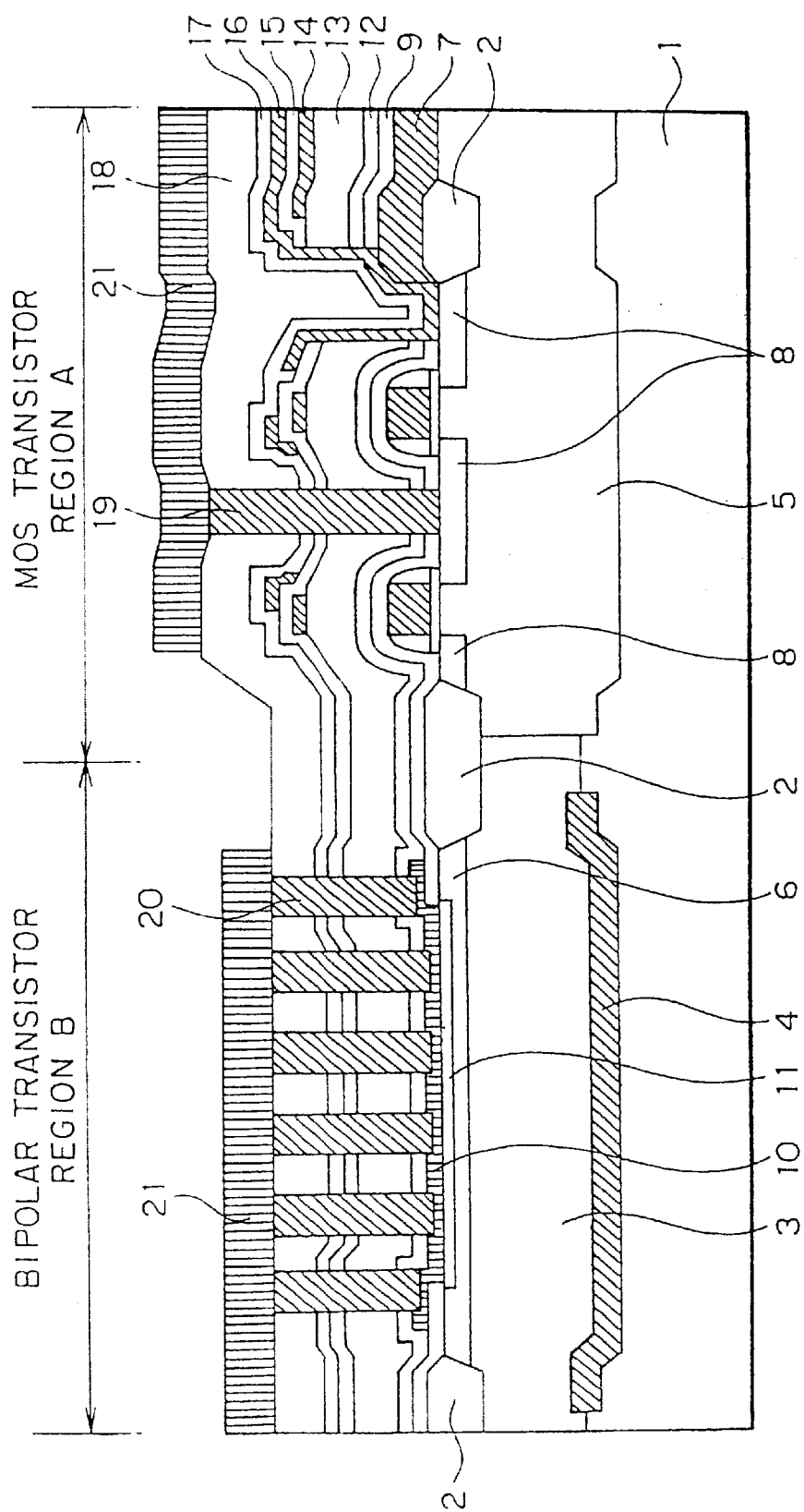
FIG. 5 is a sectional view showing a semiconductor device according to this invention.

Referring to FIGS. 3 through 5, description will be made about a semiconductor device according to an embodiment of this invention. In the illustrated embodiment, a BiCMOS SRAM is shown in the order of the manufacturing steps. Herein, it is to be noted that the same referential numbers are attached to the corresponding portions with FIG. 1 in the FIGS. 3 through 5.

In FIG. 3, a surface of a P-type silicon substrate 1 is divided into a MOS transistor region A and a bipolar transistor region B. A memory cell portion is structured by the MOS transistor region A while a peripheral circuit portion is structured by the bipolar transistor region B. In this event, the MOS transistor region A constitutes a CMOS circuit.

Subsequently, an N-type embedded layer 4 of phosphorus is formed in the bipolar transistor region B. Further, an N-type epitaxial layer 3 is formed on the silicon substrate 1 in the bipolar transistor region B. On the other hand, a P-well region 5 is formed on the silicon substrate 1 in the MOS transistor region A. In this event, the MOS transistor region A and the bipolar transistor region B are divided by an insulating film 2 for device separation. Further, a P-type intrinsic region 6 is formed as a base region in the epitaxial layer 3 of the bipolar transistor region B.

As illustrated in FIG. 4, a gate oxide film 23 and a gate electrode 7 are formed on the P-well region 5 by the use of the known process in the MOS transistor region A. Herein, the gate electrode 7 is extended on the oxide silicon film 2 to be electrically connected with the other devices. Further, an $N^+$ diffusion layers 8 are formed in the P-well region 5 to form source and drain regions 8 of the MOS transistor. Subsequently, a first oxide silicon film 9 is deposited on the gate electrode 7. Thereafter, an emitter contact hole, (not shown) is opened in the first oxide silicon film 9 in the bipolar transistor region B. Next, polysilicon is deposited to form the emitter electrode 10. Further, an emitter diffusion layer 11 is formed as the emitter region in the P-type intrinsic region 6 (base region) by the use of the ion implantation and the heat treatment.

Successively, a second oxide silicon film 12 and a third oxide silicon film 13 are deposited after the formation of the emitter electrode 10. Consequently, the emitter electrode 10 is covered with the second and third oxide silicon films 12 and 13 at the same time, the gate electrode 7 is also covered with these oxide silicon films 12 and 13. Herein, the third oxide silicon film 13 may be formed by TEOS BPSG having an excellent reflow characteristic and may have the thickness of about 500 nm. The third oxide silicon film 13 serves to flatten the surface so that no short occurs for a wiring layer during the subsequent wiring process.

Next, a ground wiring pattern 14 is formed at a predetermined position on the third oxide silicon film 13. Further, a fourth oxide silicon film 15 is deposited on the ground wiring pattern 14.

Thereafter, a contact hole (thereinafter, referred to as a common contact hole) is opened in the first, second, third and fourth oxide silicon films 9, 12, 13 and 15 to exposed either one of the source and drain regions 8 in the MOS transistor region A.

Moreover, a low resistance polysilicon 16 is selectively formed on the fourth oxide silicon film 15 and in the common contact hole so that the low resistance polysilicon 16 electrically contacts the gate electrode 7 and the $N_+$ diffusion-layers 8. Successively, a fifth oxide silicon film 17 is deposited on the low resistance polysilicon 16.

Next, as illustrated in FIG. 5, a sixth oxide silicon film 18 having the thickness of about 500 nm is deposited on the fifth oxide silicon film 17. The sixth oxide silicon film 18 may be formed by TEOS BPSG having an excellent reflow characteristic like the third oxide silicon film 13. The sixth oxide silicon film 18 also serves to flatten the surface so that no short occurs for the wiring layer.

Subsequently, contact holes 19 and 20 are opened by the dry-etching in the first, second, third, fourth, fifth and sixth oxide silicon films 9, 12, 13, 15, 17 and 18. In this example, the contact hole 19 is positioned on the $N^+$ diffusion layer 8 while the contact hole 20 is placed on the emitter electrode 10. Herein, it is to be noted that the thickness of the above oxide silicon film at the position of the contact hole 19 is thicker than that of the oxide silicon film at the position of the contact hole 20 as illustrated in FIG. 5. Further, an Al wiring layer 21 is formed on the sixth oxide silicon film 18.

Moreover, metal plugs of W are embedded in the contact holes 19 and 20. The plugs in the contact holes 19 and 20 serves to electrically contact the Al wiring layer 21 with the $N^+$ diffusion layer 8 and the emitter electrode 10.

Figure 6:
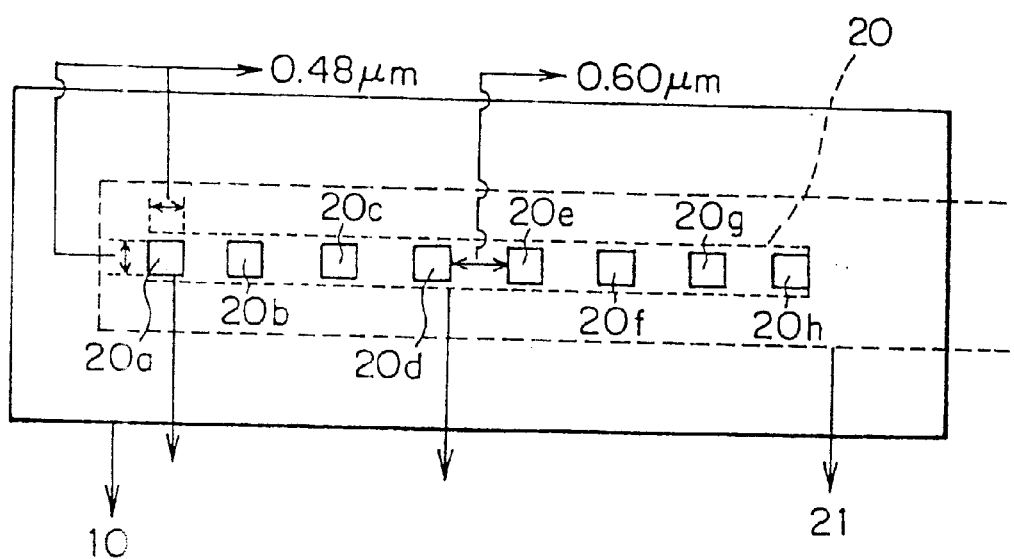
FIG. 6 a partial plan view showing a bipolar transistor region of a semiconductor device illustrated in FIG. 5.

Referring to FIG. 6 with together, the relation between the emitter electrode 10 and the contact hole 20 will be described below. The contact hole 20 is positioned below the Al wiring layer 21 and is composed of eight via holes 20a through 20h as illustrated in FIG. 6. The via holes 20a through 20h are arranged in a line and in the lateral direction. In this case, each of the via holes 20a through 20h has a square shape having a size of 0.48 $\mu$m×0.48 $\mu$m. Further, each of distances between the via holes 20a through 20h which are adjacent to each other is set to 0.6 $\mu$m.

When the contact holes 20 illustrated in FIGS. 5 and 6 are formed on the emitter electrode 10 of the polysilicon, the polysilicon of the emitter electrode 10 is partially removed or etched. However, the area of the removed emitter electrode 10 is small as compared to the conventional case illustrated in FIG. 1. Therefore, the number of the holes which recombine in the polysilicon of the emitter electrode 10 can be reduced in accordance with the ratio between the area of the contact hole 20 illustrated in FIG. 2 and the total area of the via holes 20a through 20h illustrated in FIG. 6.

consequently, the base current Ib can be reduced to increase the current amplification factor $h_{FE}$ in the structure illustrated in FIGS. 5 and 6 as compared to the conventional structure illustrated in FIGS. 1 and 2.

What is claimed is:

1. A semiconductor device, comprising:

a bipolar transistor region with a bipolar transistor having an emitter and an emitter electrode directly on said emitter;

a first wiring layer in said bipolar transistor region over said emitter electrode and separated from said emitter electrode by an insulation layer;

a MOS transistor region with a MOS transistor having a source/drain;

a second wiring layer in said MOS transistor region over said source/drain and separated from said source/drain by said insulation layer, a height of said insulation layer being greater in said MOS transistor region than in said bipolar transistor region;

a first contact plug through said insulation layer and electrically connecting said second wiring layer to said source/drain; and at least 6 separate second contact plugs through said insulation layer and electrically connecting said first wiring layer to said emitter electrode, said second contact plugs each having a height less than that of said first contact plug, said second contact plugs being directly over said emitter so that said second contact plugs overlap said emitter.

2. The device of claim 1, wherein said bipolar transistor region is separated from said MOS transistor region by an element separation layer and wherein said second contact plugs are not over said element separation layer.

3. A semiconductor device, comprising:
- a semiconductor substrate having a MOS transistor formation portion and a bipolar transistor formation portion, said bipolar transistor formation portion being adjacent to said MOS transistor formation portion by an element separation layer;
- a source/drain diffusion region on said MOS transistor portion of said semiconductor substrate;
- an emitter diffusion region on said bipolar transistor formation portion of said semiconductor substrate;
- an emitter electrode on said emitter diffusion region;
- an interlayer insulating film over said source/drain diffusion region and said emitter electrode, a first top surface of said interlayer insulating film over said source/drain diffusion region being higher than a second top surface of said interlayer insulating film over said emitter electrode;
- a first wiring layer on said first top surface of said interlayer insulating film;
- a second wiring layer on said second top surface of said interlayer insulating film;
- a first contact plug on said source/drain diffusion region through said interlayer insulating film connecting said source/drain diffusion region with said first wiring layer; and
- a plurality of second contact plugs on said emitter electrode through said interlayer insulating film connecting said emitter electrode with said second wiring layer, said second contact plugs being directly over said emitter diffusion region so that said second contact plugs overlap said emitter diffusion region.

4. The device of claim 3, wherein said bipolar transistor formation portion is separated from said MOS transistor formation portion by said element separation layer and wherein said second contact plugs are not over said element separation layer.

* * * * *